Sept. 4, 1973 W. TOUCHY 3,756,955
METHOD OF PRODUCING A GALLIUM ARSENIDE CRYSTAL FROM A SOLUTION OF GaAs IN Ga, DOPED WITH SILICON OR GERMANIUM
Filed Feb. 2, 1971
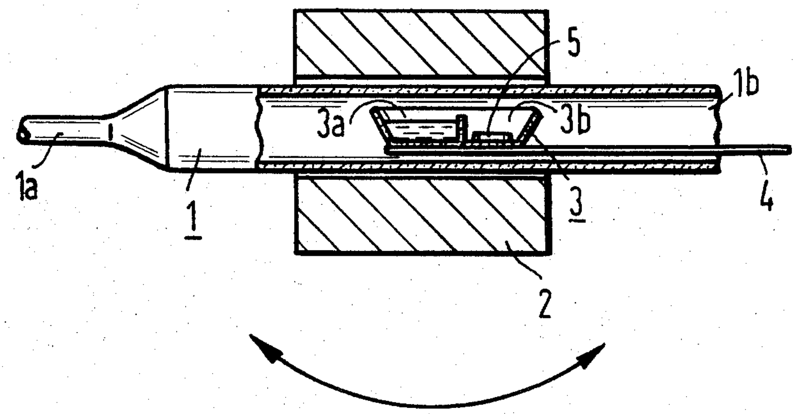

United States Patent Office 3,756,955 Patented Sept. 4, 1973

3,756,955

METHOD OF PRODUCING A GALLIUM ARSENIDE CRYSTAL FROM A SOLUTION OF GaAs IN Ga DOPED WITH SILICON OR GERMANIUM

Wolfgang Touchy, Munich, Germany, assignor to Siemens Aktiengesellschaft, Berlin and Munich, Germany Filed Feb. 2, 1971, Ser. No. 111,853
Claims priority, application Germany, Feb. 3, 1970, P 20 04 849.1
Int. Cl. H01l 3/20
U.S. Cl. 252—62.3 GA 6 Claims

ABSTRACT OF THE DISCLOSURE

Method of producing a gallium arsenide crystal from a solution doped with silicon or germanium, comprising the steps of adding silicon or germanium to a gallium arsenide containing melt, and also adding prior to the crystallization of the gallium arsenide an amount of at least about 0.5% up to about 2% by weight of aluminum.

My invention relates to a method of producing a gallium arsenide crystal from a silicon doped or germanium doped solution of GaAs in Ga.

Aside from the donors of the VI group and the acceptors of the II group of the Periodic System, the elements silicon and germanium of the IV group may also be used for doping gallium arsenide. This is known for example from the Japanese "Journal of Applied Physics," 8, No. 3, 1969, pages 348 to 357. It is noteworthy that silicon or germanium are both capable of effecting p-conductivity as well as n-conductivity. For example, when a crystal is pulled at a temperature below 970° C. out of a gallium melt compounded with gallium arsenide, then the crystallized gallium arsenide exhibits p-type conductivity while it becomes n-conductive at higher temperatures.

The doping of gallium arsenide with silicon or germanium is used primarily in the production of p-n junctions for luminescent diodes or laser diodes or other opto-electrical semiconductor devices, such as photodiodes etc. A disadvantage found in association therewith, however, is that frequently the doping is difficult to reproduce, although the gallium arsenide solutions are compounded, in a defined manner, with the dopant substance silicon or germanium (within a range of about 0.1%–1%).

The inventor recognized that these inconsistencies can be ascribed to the presence of oxygen traces. In fact, it is possible to dissolve oxygen up to a volume of $10^{19}$ atoms/cm.$^3$ in gallium arsenide. The oxygen becomes deposited at the silicon or germanium and this impairs the electrical effectiveness of these dopants.

To avoid these difficulties, and in accordance with my invention, the solution containing gallium arsenide doped with silicon or germanium is also admixed with aluminum at a concentration of about 0.5% to about 2% by weight.

As a result, the available oxygen is bound by the aluminum which has a higher affinity to this element than silicon or germanium, so that the latter two substances may develop their electrical effect while they are being built into the crystal, or upon the epitactic gallium arsenide layer precipitated thereon.

Preferably, the aluminum is added at a concentration of 0.8 to 1% by weight. The production of the solution as well as the production of the gallium arsenide crystal, or of the epitactice layer which consists of gallium arsenide, is preferably effected under hydrogen. Instead of hydrogen, it is also possible to use an oxygen-free argon or helium atmosphere.

For further elucidation, the invention will now be described by way of example with reference to the accompanying drawing.

In the drawing, 1 denotes a horizontally placed reaction tube of pure quartz. Hydrogen or an inert gas is introduced at location 1*a*, and let out at location 1*b*. The middle part of the tube is enclosed by a tubular furnace 2, which produces the temperature required for epitaxy.

First of all, solid gallium and gallium arsenide are filled into a crucible with 0.8 to 1 weight-percent oxide-free aluminum and (depending on the desired doping thickness) with 1 weight-0.1% to 1 weight-percent oxide-free silicon or germanium. In the example, the crucible contains two compartments 3*a* and 3*b*, whose common separating wall is considerably lower than the outer edge of the crucible, so that by means of tilting, a melt or solution contained in the one compartment is poured over the seed crystal 5, for example a wafer of monocrystalline gallium arsenide, which is situated in the other compartment and may subsequently be poured back. In the example, the Ga and the above-indicated substances to be dissolved in the gallium, are installed into compartment 3*a*. The seed crystal, for example a monocrystalline gallium arsenide wafer 5, is placed into the second compartment 3*b*, where the wafer is clamped tight, for example at the bottom.

The crucible 3 is then pushed, with the aid of a slide 4, into the furnace which is cold at first and is then heated to above 920° C., for example to 1000° C., so that the gallium will melt in the crucible, dissolving thereby the higher-melting substances combined therewith. The seed crystal comprising gallium arsenide is then cast with this solution. This is accomplished by tilting the arrangement. The temperature of the melt is then reduced slowly, i.e. at a rate of 0.1 to 10° C./min., declining down to 750° C. or preferably to 720° C. The solution is now tilted back, thus exposing the seed crystal. The crystal is then provided with a monocrystalline coating of gallium arsenide, which contains a p-n junction. The thus obtained arrangement is further processed into one or several diodes.

Vertical arrangements for this method are also customary. They eliminate the tilting mechanism and provide better surfaces.

In place of the described method, it is also possible to compound the solution (in this instance preferably situated in an elongated boat-like melting vessel) continually, at one locality, with fresh gallium arsenide, doping material and aluminum, while a continuous crystallization from the solution takes place in another locality, at a seed crystal provided for this purpose. To this end, the point of dissociation is tempered about 10 to 100° C. higher than the crystallization point and a temperature gradient pointing from the crystallization point to the dissociation point, is produced in the solution.

I claim:

1. Method of precipitating a gallium arsenide crystal from a solution of gallium arsenide, doped with silicon or germanium, in liquid gallium, comprising adding at least 0.5% by weight to about 2% by weight of aluminum and epitaxially precipitating gallium arsenide upon a gallium arsenide seed crystal dipped into said solution.

2. The method as claimed in claim 1, comprising the step of adding about 0.1% to about 1% by weight of silicon or germanium and about 0.8 to 1% by weight of aluminum.

3. The method according to claim 1, wherein the production of the solution, its doping, as well as the crystallization of the gallium arsenide from the solution, are effected under hydrogen or an inert protective gas, such as argon or helium.

4. The method as claimed in claim 1, which comprises producing a temperature gradient in the solution, continually replenishing gallium arsenide, aluminum and silicon or germanium at the hottest locality of the solution, and permitting continuously doped gallium arsenide to crystallize at the coldest location of the solution.

5. The method as claimed in claim 1, which comprises heating the solution above 920° C. and subsequently slowly cooling the solution to a temperature below 920° C. at a rate of 0.1 to 10° C./min., the gallium arsenide being crystallized at said latter temperature.

6. The method as claimed in claim 1, which comprises heating the solution above 920° C. and subsequently slowly cooling the solution to a temperature below about 720° C. at a rate of 0.1 to 10° C./min., the gallium arsenide being crystallized at said latter temperature.

References Cited

UNITED STATES PATENTS 3,560,275 2/1971 Kressel et al. ------- 148—171

GEORGE T. OZAKI, Primary Examiner

U.S. Cl. X.R.

148—171, 172, 1.5; 23—301 SP